United States Patent [19]

Krause

[11] Patent Number: 4,600,656

[45] Date of Patent: Jul. 15, 1986

[54] ELECTROLESS METAL PLATING OF PLASTICS

[75] Inventor: Lawrence J. Krause, Chicago, Ill.

[73] Assignee: The United States of America as represented by the United States Department of Energy, Washington, D.C.

[21] Appl. No.: 617,654

[22] Filed: Jun. 5, 1984

Related U.S. Application Data

[62] Division of Ser. No. 420,054, Sep. 20, 1982, Pat. No. 4,459,330.

[51] Int. Cl.$^4$ ............................................. C23C 18/46
[52] U.S. Cl. ................................. 428/446; 427/443.1; 428/458; 428/461; 428/451; 428/471; 428/473.5; 428/543
[58] Field of Search ................... 428/473.5, 446, 451, 428/458, 461, 471, 543; 427/443.1

[56] References Cited

U.S. PATENT DOCUMENTS

| | | | |
|---|---|---|---|
| 3,063,850 | 11/1962 | Mikalski | 106/1.27 |
| 3,821,016 | 6/1974 | DeAngelo | 427/443.1 |
| 4,396,679 | 8/1983 | Gaku | 428/473.5 |
| 4,459,330 | 7/1984 | Krause | 427/443.1 |

*Primary Examiner*—John D. Smith
*Attorney, Agent, or Firm*—William Lohff; Hugh W. Glenn; Judson R. Hightower

[57] ABSTRACT

Process for plating main group metals on aromatic polymers is carried out by the use of a nonaqueous solution of a salt of an alkali metal in a positive valence state and a main group metal in a negative valence state with contact between the solution and polymer providing a redox reaction causing the deposition of the main group metal and the reduction of the polymer. Products from the process exhibit useful decorative and electrical properties.

6 Claims, No Drawings

ELECTROLESS METAL PLATING OF PLASTICS

CONTRACTUAL ORIGIN OF THE INVENTION

The U.S. Government has rights in this invention pursuant to Contract No. W-31-109-ENG-38 between the U.S. Department of Energy and the University of Chicago representing Argonne National Laboratory.

This is a Division of application Ser. No. 420,054 filed Sept. 20, 1982, now U.S. Pat. No. 4,459,330.

BACKGROUND OF THE INVENTION

This invention relates to a process for metal plating of plastics and more particularly to plated plastics where the metal platings are composed of main group metals such as Ge, Sn and As. More specifically, the invention relates to the formation of metal platings from certain salts of the main group metals where the main group metal to be deposited is in the negative oxidation state and is oxidized in the process.

Metallized plastics have been found useful in the electrical, automotive and other industries for their electrical, reflective, and decorative properties. Previously, electroless deposition processes have been developed to chemically deposit a metal on a polymeric substrate by a reduction of the metal from a solution of the metal salt. In these previous processes, the polymeric substrate is first sensitized by treatment with certain other metal salts to cause the desired reduction and deposition of metal. While these electroless techniques are useful, they have not generally been applied to the deposition of many of the main group metals.

One technique for chemically depositing main group metals has involved the decomposition of metal hydrides by exposure to hot substrates to form the metal platings. In some instances, the process has been difficult to control and explosive conditions have been encountered. Accordingly, one object of the invention is a chemical process for plating main group metals on a polymeric substrate. A second object is a process for plating main group metals under mild conditions of temperature and pressure. An additional object is a process for plating a polymeric substrate which does not require an initial sensitizing step. Another object is a process for plating a polymeric substrate which provides metal platings having a varied thickness.

SUMMARY OF THE INVENTION

Briefly, the invention is directed to an electroless process for plating a main group metal or metals on the surface of a polymeric substrate. The process involves forming a solution containing a metal salt of an alkali metal in a positive valence state and the main group metal in a negative valence state, selecting a polymeric substrate characterized by repeating aromatic groups, and conducting a redox reaction by contacting the solubilized salt with the surface of the substrate for a sufficient time to oxidize and deposit the main group metal in elemental form to produce a plated substrate. In the oxidation and deposition step, the alkali metal of the metal salt is retained in the plated substrate with the substrate being reduced by electrons transferred from the main group during the redox reaction.

DETAILED DESCRIPTION OF THE PREFERRED EMBODIMENT

The inventive electroless process for plating a main group metal on a polymeric substrate includes the steps of forming a solution of a salt of an alkali metal and a main group metal or metals in a nonaqueous polar solvent with the main group metal being in a negative valence state, selecting a polymeric substrate characterized by repeating aromatic groups and conducting a redox reaction by contacting the salt in solution with the surface of the substrate for a sufficient time to oxidize and deposit the main group metal in elemental form to produce a plated substrate. In the process, the alkali metal is retained in the plated substrate as a cation and the substrate is reduced by electrons transferred from the main group during the redox reaction. While many of the platings are continuous metal films, it is to be understood that the platings include polycrystalline and granular deposits which in some instances may be discontinuous.

In the process, a solution is first formed of an alloy of an alkali metal in a positive valence state and a main group metal or metal in a negative valence state. Alloys of alkali and main group metals such as $K_4Sn_9$, $K_4Ge_9$ and $K_3Sb_7$ are known to be salt-like in structure. These alloys when treated with nonaqueous polar solvents such as ethylenediamine or ammonia dissolve to form metallic cations and homopolyatomic anions, frequently referred to as clusters as illustrated by the following

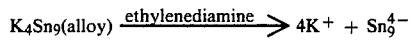

In the cluster, the subscript indicates the number of metal atoms and the superscript indicates the number of excess electrons.

Suitably, the alloy is formed of an alkali metal with a normal valence of $+1$ such as potassium, sodium or lithium and preferably potassium, and a main group metal or metals. Suitable main group metals include Ge, Sn, Pb, As, Sb, Bi, Si and Te with Sn, Pb and Sb being preferable. The process may also be used to deposit alloys of the main group metals that exist as heteropolyatomic anions in solution such as $Sn_8Tl$, $Sb_3As_4$ and $Pb_4Sn_5$.

The alloy of the alkali and main group metal is disolved in a nonaqueous, polar solvent to provide a medium for the redox reaction in which the main group metal is oxidized to its elemental form and the polymeric substrate is reduced by acquiring excess electrons. These solvents suitably include those known to dissolve these alloys such as primary and secondary alkyl (including alkylene) amines containing about 2-4 carbon atoms such as ethylamine, propyl amine, butyl amine, ethylenediamine and the like—amides such as dimethyl formamide—ammonia and the like. Combinations of these solvents with hydrocarbon solvents such as toluene are useful with a 50/50 combination of ethylenediamine and toluene being particularly useful.

The advantage of the alloy in solution is associated with the main group metal being in a negative valence state and capable of being readily oxidized back to the elemental state by a substrate redox reaction. In this reaction, the main group metal is oxidized to the elemental form ($Sb_7^{-} \rightarrow 7Sb^0 + 3e^-$) while the substrate is reduced.

In general, suitable polymers that are reducible by the solubilized salts of the main group metals are characterized by repeating aromatic groups. For favorable plating results, they also exhibit resistance to degradation by the solvents and/or the alkali metal cations. This resistance may be exhibited either in the original polymeric form or as in the reduced form. As an illustration, treatment of a polyester film (Mylar) with a solution of ethylenediamine and a potassium-tin salt results in the reduction of the polyester as indicated by a change in color; however, the reduced film becomes degraded and partially solubilized. With polystyrene and a similar solution, the degradation also occurs but at a lower rate.

It has been found that aromatic polyimides, polysulfones and copolymers of styrene and vinyl pyridine provide favorable results. In view of the increased rates of the redox reaction and platings produced on the aromatic polyamides and polysulfones that the presence of electron-withdrawing groups are preferred adjacent to the aromatic ring either in the polymeric backbone or as substituents. Accordingly, suitable polymers include aromatic polyimides, polyamides, polysulfones, styrene polymers with vinyl pyridine, substituted styrene polymers with electron-withdrawing groups and other polymers with the above characteristics. The preferred polymers include the polyimides and polysulfones.

Advantageously, the polymers include electron withdrawing groups in the backbone or as substituents on the aromatic groups. Illustrative of those in the backbone are carbonyl and sulfonyl groups while the groups substituted on the aromatic groups may include nitrite, thiocyanide, cyanide, ester, amide, carbonyl, halogen and similar groups.

As is known, aromatic polyimides may be illustrated by the following

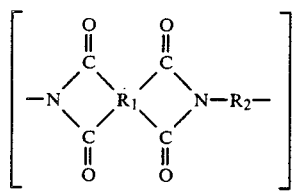

where $R_1$ and $R_2$ are single or multiple aromatic groups. Polysulfones may be illustrated by the following:

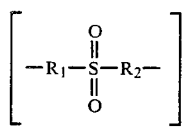

where $R_1$ and $R_2$ represent single and multiple aromatic groups as in

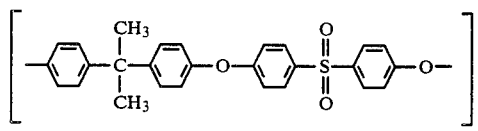

In the copolymer of styrene and vinyl pyridine, the general repeating units are

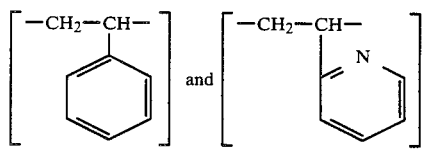

In the plating process, the alloy solution is contacted with the substrate for a time sufficient to oxidize and deposit the main group metal in elemental form on the substrate. In the reaction, the alkali metal is retained by the plated substrate and functions as a substrate cation. Suitably, conditions include an inert atmosphere, a temperature in the range of about 0°–50° C. and preferably about 20°–30° C., and a time which may vary from a fraction of a minute to about 5–10 minutes (although in some instances, the time may be in the order of 24 hours). The shorter times are evident for solutions of tin salts in ethylenediamine in contact with an aromatic polyimide.

The plating formed in the process may vary in thickness and may range between a few angstroms to a considerable thickness. Advantageously, the range of thicknesses may be 50 Å to 5000 Å. Based on tests with tin plating, the metal plating exhibits electrical and other properties identifiable with bulk tin. In addition, the plating exhibits good adhesion to a polyimide substrate. Preferably, the following general instructions are used in carrying out the process. In the preparation of the alloy, the constituents of a typical alloy such as $K_4Sn_9$, are weighed in an argon atmosphere and combined in a quartz tube fitted with an air-tight adaptor. The tube and its contents are removed from the argon atmosphere and attached to a glass vacuum system. The tube and its contents are then exposed to a flow of high purity argon while the quartz tube and its contents are heated by an oxygenated flame. After fusion of the elements has occurred, and the contents of the tube have liquefied, the tube is allowed to cool to room temperature. It is then evacuated and returned to the argon atmosphere glove box. The prepared alloy ingot of nominal composition $K_4Sn_9$ is easily reduced to a powder with the aid of a pestle and mortar.

All the alloys with the exception of $K_4Si_9$ can be prepared in this manner. $K_4Si_9$ is best prepared by combining the elements in a sealed tantalum tube, then sealing this tube inside an evacuated quartz tube, then heating in an oven for several days at 900° C., followed by quenching.

Prior to the formation of the solution, the solvent must be carefully dried and deoxygenated because of the high reactivity of the metal cluster and particularly those with Group 3, 4 and 5 metals as opposed to Group 6 chain species such as $Te_3^{2-}$.

Purification of ethylenediamine is carried out by refluxing the ethylenediamine over $CaH_2$ for approximately 24 hours, then distilling. For more reactive alloys such as $K_4Si_9$ and $K_4Ge_9$, additional drying may be necessary. This is accomplished by stirring the ethylenediamine over sodium in the argon atmosphere box, then vacuum distilling the ethylenediamine.

Anhydrous ammonia can be purified (dried) by passing $NH_3(g)$ through a trap held at $-45°$ C. or by stirring over sodium, then vacuum distilling. Dimethylformamide and toluene (used in combination with ethylenediamine) can be dried by refluxing over calcium hydride.

In preparing the solution, the alloys $K_4Sn_9$, $K_4Ge_9$, $K_4Pb_9$ readily dissolve in ethylenediamine yielding intensely colored red solutions, $K_3Sb_7$ dissolves slowly in ethylenediamine yielding $Sb_7^{3-}$ clusters of sufficient concentration to affect metal plating only after approximately 24 hours. ($K_4Si_9$ or KSi dissolve in ethylenediamine, yielding typical red-brown solutions but at insufficient concentrations to effect visible plating on polyimide,) although some plating occurred around the periphery of the sample. Concentrations of the alloy in solution are typically in the millimolar range (per liter).

Many of the alloys will also dissolve in DMF, such as $K_4Sn_9$ and $K_4Pb_9$, KBi, for instance. In general, better plating is obtained from ethylenediamine solutions rather than DMF.

Typically, 250 mg of $K_4Sn_9$ is added to dried ethylenediamine, 20–30 minutes is allowed for total (maximum) dissolution solution of the alloy (the total 250 mg does not dissolve owing to nonhomogeneity of the alloy) and the solution is now ready for metal plating of polyimide.

In the preparation of a polymeric substrate such as an aromatic polyimide (available under the Kapton trademark), the most effective procedure for preparing polyimide involves a simple bakeout procedure of the polymer at approximately 200° C. in air. No solvents or cleaning agents are used.

Plating of the substrate is accomplished by immersion of polyimide into the cluster solution. The depth of coverage (determined gravimetrically) is seen to vary from a few hundred angstroms to approximately 5000 Å. Immersion time vs depth of coverage is generally dependent on solution concentration but typical times are 10–100 sec for $K_4Sn_9$ (e.g., $Sn_9^{4-}$) although metallization is apparent after shorter times. In the case of $Sn_9^{4-}$ and $Sb_7^{3-}$, mixed solvent systems of 50% v/v toluene and ethylenediamine have been employed with generally favorable results with respect to electrical properties and appearance. Plated substrates are washed immediately after plating, with liquids such as toluene. With mixed solvent systems (ethylenediamine and toluene, this wash is generally not necessary.

For electrical properties (e.g., Sn) a two probe method is employed to measure the D.C. resistivity. Annealing the plated substrate at approximately 120° C. for Sn, improves the resistivity (in the direction of bulk metal).

Characterization of the metal plating may be carried out by x-ray powder techniques and scanning electron microscopy (SEM). Metals identified (as plated) by x-ray powder analysis include Ge, Sn, Pb, Sb, and an alloy of $As_xSb_y$ (exact composition being unknown). SEM also confirms the presence of the metal as determined through x-ray fluorescense. The surface is grainy, and microcrystalline. Discontinuous films can be grown from very dilute cluster solutions.

The following examples are provided for illustrative purposes and are not intended to be restrictive as to the scope of the invention:

EXAMPLE I

In an inert atmosphere (argon) potassium and tin were combined in a quartz tube (12 mm O.D.) fitted with a Swagelok adaptor equipped with a glass stopcock. The glass stopcock was closed and the quartz tube with its contents were removed from the argon atmosphere. The tube was connected to a vacuum system, and the space above the closed stopcock evacuated to $10^{-3}$ torr, then filled with high purity argon gas. Backfilling with argon was accomplished through a dynamic flow of gas. Pressure equilibration was accomplished by a mineral oil bubbler vented to the ambient atmosphere. The stopcock was then opened and the contents of the tube heated in an oxygenated flame until liquefication of its contents. The quartz tube was then allowed to cool to room temperature and returned to the argon glove box.

The alloy ingot (nominal composition $K_4Sn_9$) was pulverized to a powder by the use of a pestle and mortar. About 250 mg of the powdered alloy was added to about 15 ml of dried ethylenediamine resulting in an intensely red colored solution. Not all the alloy dissolved.

Metal plating of an aromatic polyimide (Kapton) was accomplished by immersion of the polymer (previously baked at 200° C. for approximately 2 hours in air) into the solution followed by a wash with toluene. The depth of coverage varied with the time of immersion.

EXAMPLE II

In a second test, 5 ml of the above solution ($K_4Sn_9$ in ethylene diamine) was diluted to 10 ml with dried toluene. Immersion of the polyimide in this solution produced a metal coating with good adherence to the polymer. Based on the resistivity of the metal coating after a short annealing period, the coating exhibited properties of bulk tin.

EXAMPLE III

Similar plating tests were carried out with solutions of $Ge_9^{4-}$, $Sb_7^{3-}$ and $Pb_9^{4-}$. Deposits of the elemental metal were confirmed by the use of x-ray analysis and scanning electron microscopy.

In another test with a conventional nylon (nonaromatic), it was noted that contact between the solution of a potassium-tin salt and the nylon did not result in the desired redox reaction although the nylon appeared to be resistant to the solution.

As revealed by the above disclosure, the invention provides a useful process for plating main group metals on polymeric substrates characterized by repeating aromatic groups. Products of the process also exhibit properties useful for decorative, electrical and other purposes.

The embodiments of the invention in which an exclusive property or privilege is claimed are defined as follows:

1. The product of an electroless plating process for plating at least one main group metal directly on a surface of a polymeric substrate comprising the steps of forming a nonaqueous solution containing a metallic salt of an alkali metal in a positive valence state and at least one main group metal in a negative valence state, the main group metal being selected from the group consisting of Ge, Sn, Pb, As, Sb, Bi, Si and Te, selecting an aromatic polymeric substrate reducible by the solublized salt and resistant to degration during the reaction, and carrying out a redox reaction between the salt in solution and the substrate by contacting the solution with the substrate for a sufficient time to oxidize and deposit the main group metal in elemental form to produce a plated substrate, the product being characterized by the plated metal being directly on the surface of the polymeric substrate and the alkali metal being retained in the plated substrate with the substrate being negatively charged with electrons transferred from the main group metal during the redox reaction.

2. The product of claim 10 wherein the polymer substrate is composed of an aromatic polyimide, polysulfone or copolymer of styrene and vinylpyridine.

3. The product of an electroless plating process for plating a surface of a polymeric substrate comprising the steps of forming a solution containing a metallic cluster of potassium in a positive valence state and tin in a negative valence state in an ethylenediamine solvent, contacting the solution with an aromatic polyimide substrate under an inert atmosphere at a temperature in the range of 20°-30° C. for about 10-100 seconds to oxidize and deposit the tin in elemental form directly on the aromatic polyimide to produce a plated polyimide substrate, and removing the plated substrate from contact with the solution, the product being characterized by the tin plating being directly on the surface of the polyimide substrate and the potassium being retained in the plated polyimide substrate.

4. The product of claim 1 wherein the product is further characterized by a negatively charged substrate from electrons transferred from the main group metal during the redox reaction.

5. The product of claim 4 wherein the substrate is an aromatic polyimide.

6. The product of claim 4 wherein the substrate is an aromatic polysulfone.

* * * * *